United States Patent [19]

Hall

[11] 4,251,834
[45] Feb. 17, 1981

[54] BLOCK OUTPUT CCD IMAGER

[75] Inventor: Joseph E. Hall, Richardson, Tex.

[73] Assignee: Texas Instruments Incorporated, Dallas, Tex.

[21] Appl. No.: 42,749

[22] Filed: May 29, 1979

[51] Int. Cl.³ .............................................. H04N 3/14
[52] U.S. Cl. ..................... 358/213; 357/24; 358/209
[58] Field of Search ............... 358/209, 41, 213, 160, 358/167, 166; 357/24; 365/183

[56] References Cited

U.S. PATENT DOCUMENTS

| 4,001,501 | 1/1977  | Weimer .......................... 358/213 |
| 4,031,315 | 6/1977  | Pfleider .......................... 358/213 |
| 4,064,533 | 12/1977 | Lampe ........................... 358/213 |
| 4,079,422 | 3/1978  | Anagnostopoulos ........... 358/213 |
| 4,081,841 | 3/1978  | Ochi ............................... 358/213 |
| 4,169,273 | 9/1979  | Hendrickson .................. 358/213 |
| 4,178,614 | 12/1979 | Saver ............................. 358/213 |

Primary Examiner—Robert L. Griffin
Assistant Examiner—Michael A. Masinick
Attorney, Agent, or Firm—Thomas C. Devine; Leo N. Heiting; Melvin S. Sharp

[57] ABSTRACT

A charge-coupled device (CCD) imager has an output shift register having a number of bits equal to at least a multiple (N), where N is an integer greater than 1, times the number of columns of pixels in the imager. Appropriately spaced in the output shift register are N groups of N outputs each for non-destructive, simultaneous readout of N×N bits. The N×N bits are then available for pre-processing or display without the requirement for having previously stored each bit, digitally represented, in a computer memory.

16 Claims, 6 Drawing Figures

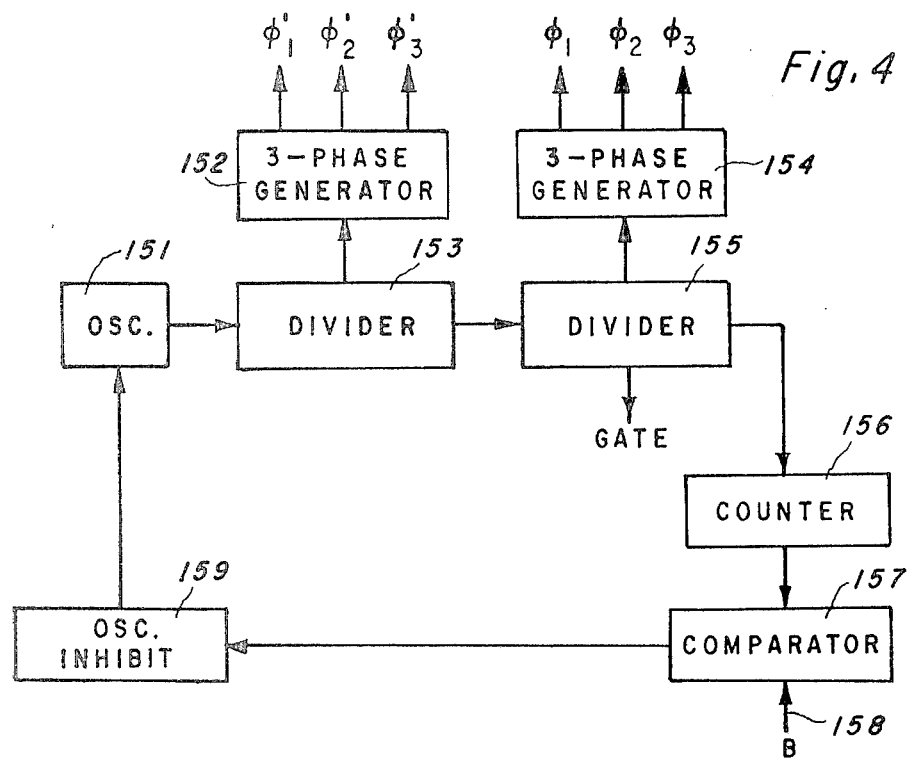
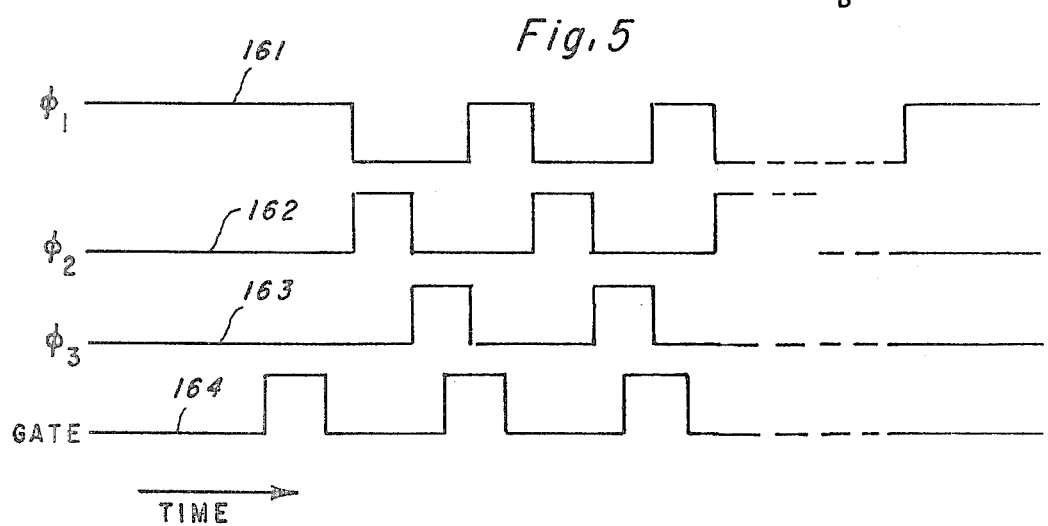

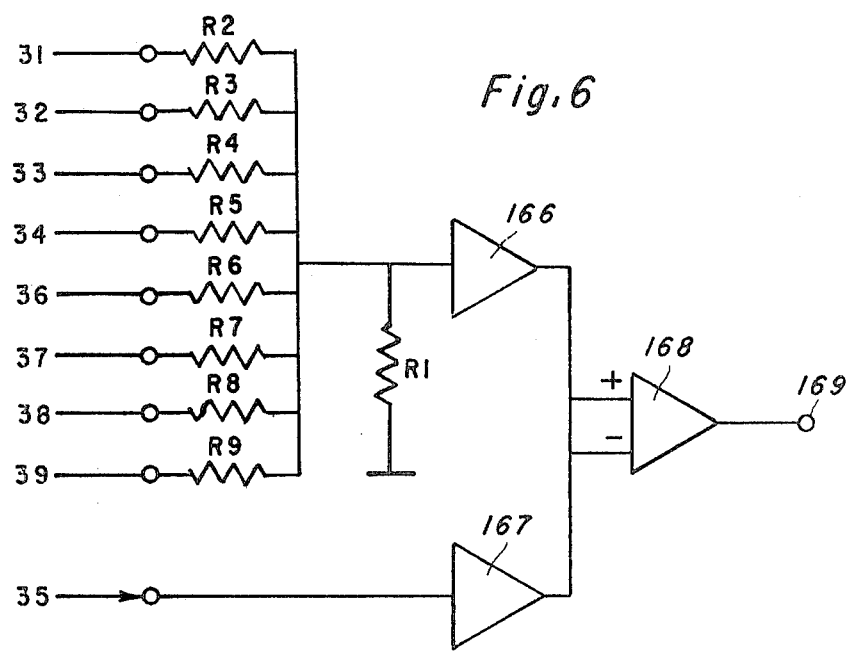

BLOCK OUTPUT CCD IMAGER

BACKGROUND OF THE INVENTION

1. Field of the Invention

This invention relates to electronic imaging. More specifically, it relates to CCD imaging wherein a plurality on non-destructive readouts are simultaneously available.

2. Description of the Prior Art

In the past, there have been efforts to implement solid state image sensors that use a matrix of photosensors addressed in X and Y coordinates by decoders or shift registers so as to select each individual element in turn and read out its charge. Because of various limitations, this approach has not been popularly accepted.

Another approach was to use a CCD imager that senses a single line. This linear sensor can be used in a two dimensional sense by using a mechanical scanner such as a rotating mirror or moving the object to be scanned in front of the sensor.

Another CCD imager is an array image sensor that senses a two dimensional object and transfers the charge packets from the imager into a register so that all charge packets making up the image are detected at a single output diode. The output signals are then typically digitized and put into the memory of a computer. After having been digitized, it is common practice to handle a block of imager pixels, represented by digital words. Information from the block is to the effect that there was a transition from white to black, there was a shading in color, etc.

This invention permits the simultaneous readout of 9 pixels so that there is no requirement to digitize and place in a memory. The analog, charge packet signals can be handled directly in combination in a desired manner. The result may then be digitized and stored.

BRIEF SUMMARY OF THE INVENTION

A CCD imager is formed in a semiconductor chip of A columns and B rows of pixels. The imager has a CCD output register having N (where N is an integer greater than 1)$\times$A+additional positions dictated by the geometry of the imager chip.

There are provided N non-destructive outputs in N groups of such outputs. The outputs are positioned essentially at the end of N positions of the output register so that the simultaneous readout of N$\times$N positions represents a block of pixels from the imager face itself. The next reading of N$\times$N positions amounts to a block having been moved by one column. Each time a block is read out, it can be pre-processed and/or displayed. A block is typically made up of 9 pixels and therefore amounts to a very careful scrutiny of the center pixel of the block. The scrutiny is accomplished without resorting to digitizing all of the charge outputs representing the pixels of a block.

Also disclosed is circuitry for an application utilizing the CCD imager of the invention to compensate for uneven illumination of the image object by assigning values to each position in a block and then performing a simple mathematical calculation to determine whether the background lighting for that particular block is essentially uniform.

The principal object of this invention is to provide a CCD imager capable of providing a simultaneous block output of a desired size for further handling by data processing apparatus.

This and other objects will become evident in the detailed description that follows.

BRIEF DESCRIPTION OF THE DRAWINGS

FIG. 4 illustrates, in block form, the timing circuit for the imager.

FIG. 5 illustrates typical waveform signals used in the imager.

FIG. 6 is a schematic of an application of this invention.

DETAILED DESCRIPTION OF THE INVENTION

Figure 1:
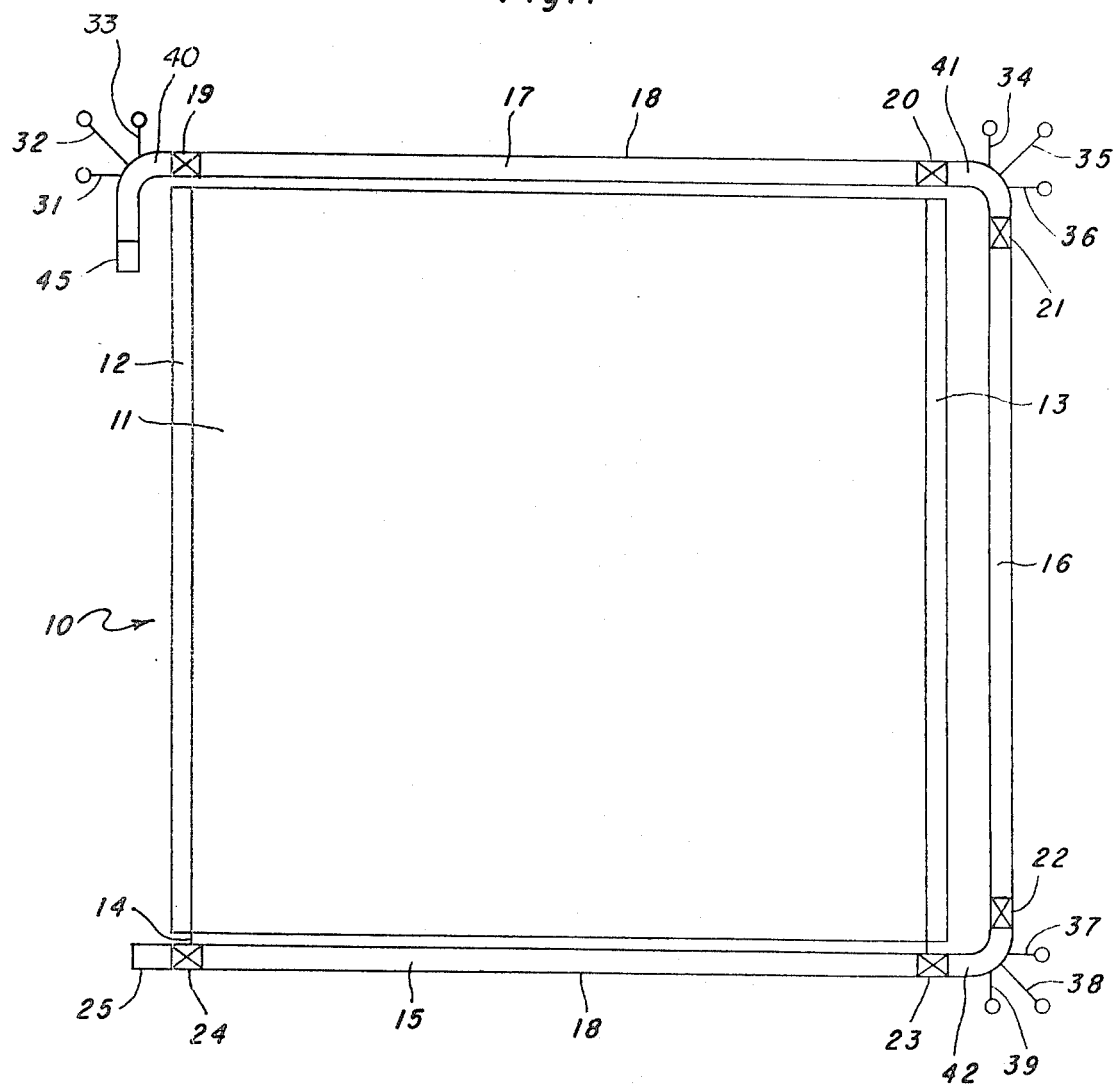
FIG. 1 is a block-type plan view of the imager.

FIG. 1 shows imager 10 having an imager matrix 11 comprised of A columns of pixels (324 in this preferred embodiment) and B rows of pixels (340 in this preferred embodiment). The image array drive lines 12 provide the drive line signals $\phi1$, $\phi2$ and $\phi3$ (see FIG. 5) to the imager matrix 11 and to transfer gate 14. Transfer gate 14 has a CCD position attached to each column of the imager matrix and is connected to the CCD output register 18 to selectively transmit an entire row of pixels, in parallel, from imager matrix 11 into output register 18.

Input diode 25 (used for testing purposes) is serially connected to additional position 24 of register section 15, terminating in additional position 23. Corner output group 42 is serially connected to additional position 23 and to additional position 22 of register section 16, which terminates in additional position 21. Corner output amplifier group 41 is serially connected to additional position 21 and to additional position 20 of register section 17 which terminates in additional position 19. Corner output amplifier group 40 is serially connected to extra position 19 and terminates in charge drain diode 45. The corner output amplifier 40-42 groups and register sections 15-17 make up output register 18.

Corner output amplifier group 40 includes outputs 31-33; corner output amplifier group 41 includes outputs 34-46; corner output amplifier group 42 includes outputs 37-39.

Figure 2:
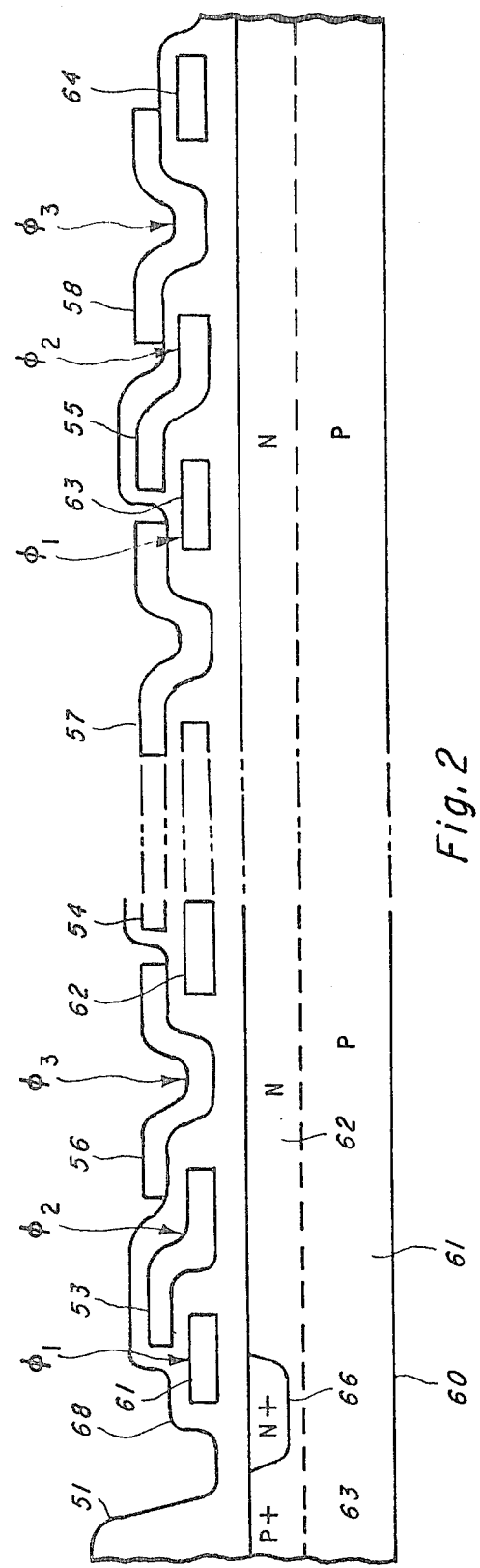
FIG. 2 is a cross section of the CCD imager.

FIG. 2 is a cross section of the three-phase CCD structure of this preferred embodiment wherein three overlapping levels of polysilicon electrodes are employed. Polysilicon electrode 61 to which phase $\phi1$ is applied is contained within silicon dioxide envelope 68. Phase $\phi2$ is applied to electrode 53, also surrounded by silicon dioxide envelope 68. Phase $\phi3$ is applied to electrode 56, which is partially surrounded by envelope 68. FIG. 2 is intended to represent two sides of the CCD imager, and not all of the center, identical portions. Thus, electrode 54 to which phase $\phi2$ is applied is partially shown at the left center of the drawing with electrode 57 to which phase $\phi3$ is applied as shown at the right center of the drawing. Electrodes 63 and 64 each have phase $\phi1$ applied thereto and are totally surrounded by envelope 68. Electrode 55 has phase $\phi2$ applied and is surrounded by envelope 68. Electrode 58 has phase $\phi3$ applied and is partially surrounded by envelope 68.

This preferred embodiment utilizes buried layer 62 of an N type material to cause electrons to be forced away from the surface and toward the main body 61 of P type material. The P+ regions 63 and 64 are channel stop areas. The N+ region 45 is the charge drain diode cathode. Walls 51 and 52 define the active area 11.

Figure 3:
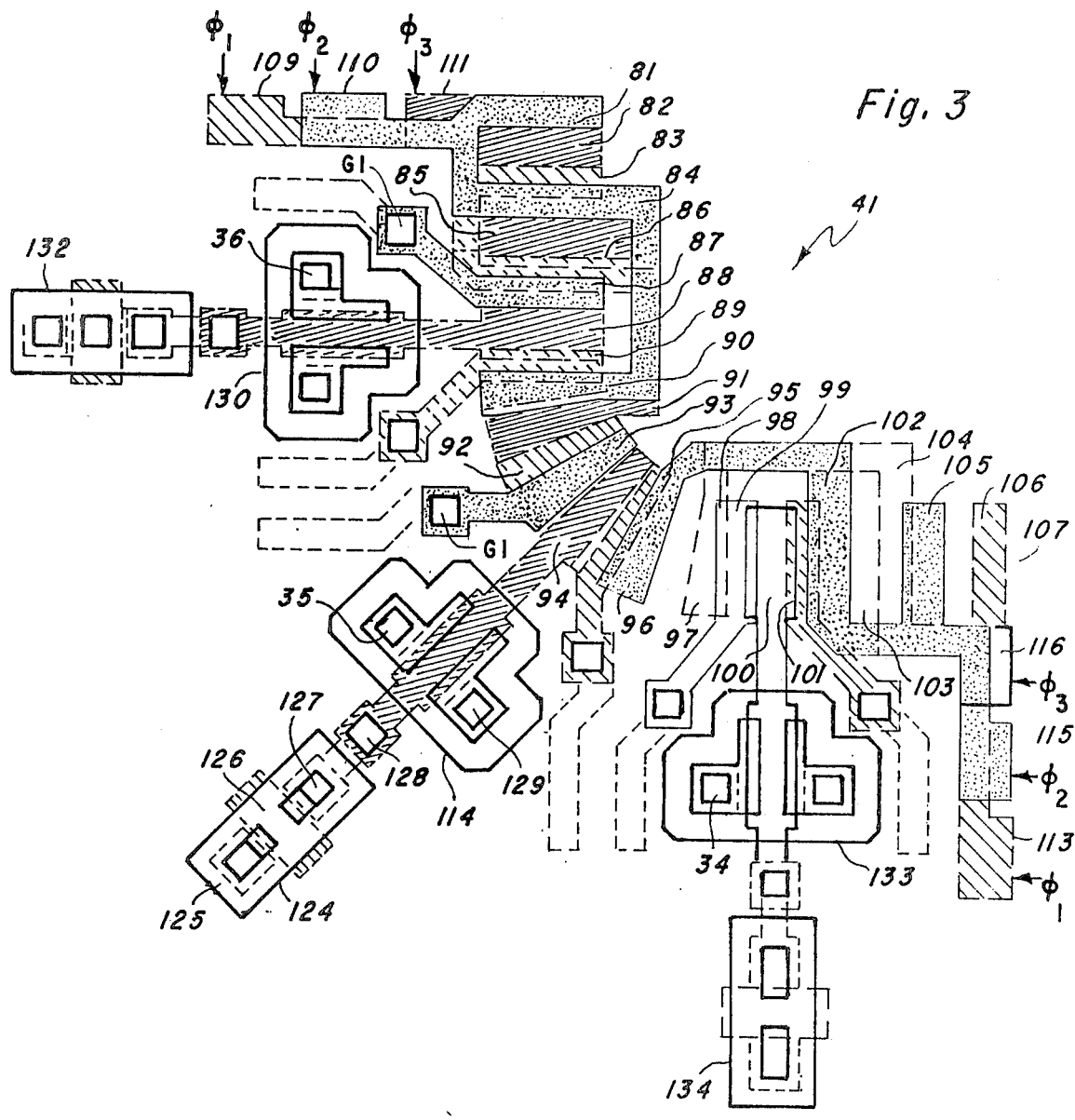
FIG. 3 is a plan view of one group of N non-destructive readout circuits attached to the CCD output register.

FIG. 3 is a plan view of corner output amplifier group 41. Corner output amplifier group 41 is representative of corner output amplifier groups 40 and 42. Electrodes 81–107 are positioned in a curved path to form a corner so that electrode 81 is at right angles to electrode 107.

As shown in FIG. 2, the lowest level electrode is that to which phase $\phi 1$ is applied. In this FIG. 3, terminals 109 and 113 receive phase $\phi 1$. Terminal 109 is connected to electrodes 83, 86, and 92. Terminal 113 is connected to electrodes 98, 104 and 107. Electrodes 89, 95 an 101 are formed at the same level and are output control gates. The next level of electrodes is that receiving phase $\phi 2$. In FIG. 3, terminals 110 and 115 receive phase $\phi 2$. Terminal 110 is connected to electrodes 81, 84 and 90. Terminal 115 is connected to electrodes 96, 102 and 105. Electrodes 87, 93 and 99 are also formed at the phase $\phi 2$ level and are input control gates for the floating gate amplifiers.

The highest level phase electrode is that for receiving phase $\phi 3$. In FIG. 3, phase $\phi 3$ is applied to terminals 111 and 116. Terminal 111 is connected to electrodes 82, 85 and 91. Terminal 116 is connected to electrodes 97, 103 and 106. Also formed at the phase $\phi 3$ level are floating gates 88, 94, and 100, for the floating gate amplifiers. The floating gate formed by electrode 94 is the gate for MOS output transistor 114, having drain 129, and source 35 which serves as its output. MOS transistor 124 has drain 125, gate 126 and source 127, source 127 being connected through connector 128 to the floating gate 94. Transistor 124 supplies a potential to floating gate 94. Electrode 93 forms input control gate G1 for amplifier transistor 114 and electrode 95 forms the output control gate G2 for the output amplifier transistor 114. Transistors 114 and 124, together with input control gate G1 and output control gate G2 form a floating gate amplifier for providing an output representative of the charge at the particular electrode at source output 35. The combination of transistors 130 and 132, and 133 and 134, together with their respective input gates formed by electrodes 87 and 99, respectively, and their output gates formed by electrodes 89 and 101, respectively, represent two more floating gate amplifiers with outputs at sources 36 and 34, respectively. Details of this floating gate amplifier are set out in copending patent application Ser. No. 021,058, filed Mar. 16, 1979, entitled "Remote Coupled Floating Gate Amplifier for Charge Coupled Devices" and assigned to the assignee of this invention. In this preferred embodiment, N=3 and therefore there are three floating point amplifiers in one corner output amplifier group. This corner output amplifier group 41 is identical to corner output amplifier groups 40 and 42.

FIG. 4 illustrates, in block form, the timing circuitry that may be used in this invention. A crystal oscillator 151, having a frequency of approximately 6 MHz provides an input to divider 153. An appropriate output from divider 153 at approximately 2 MHz is sent to three phase generator 152 which provides three phases $\phi 1'$, $\phi 2'$ and $\phi 3'$ for the three phase input to CCD output register 18. The output of divider 153 is sent to divider 155 where the frequency is further divided to provide phases $\phi 1$, $\phi 2$ and $\phi 3$. Phases $\phi 1$, $\phi 2$, and $\phi 3$ are applied to the imager matrix 11 and to transfer gate 14. The gate output from divider 155 is used to enable the output of transfer gate 14. Phases $\phi 1'$, $\phi 2'$ and $\phi 3'$ at B (340)×the frequency of the three phase input to imager matrix 11 are applied to CCD output register 18.

The output of divider 155 is counted at counter 156 whose output is sent to comparator 157 having a second input 158 with a count of B (340) as the second input. If there is a comparison, then all the rows from imager matrix 11 must have been transferred to output register 18. Oscillator inhibit 159 is activated turning off the oscillator 151. In this preferred embodiment, the oscillator is held off for a period of approximately 600 milliseconds, and then is kept running for a period of approximately 200 miliseconds to enable the transfer of the pixel information entirely out of the imager matrix.

FIG. 5 shows the phases $\phi 1$, $\phi 2$ and $\phi 3$ in idealized form. While the oscillator 151 is held off, $\phi 1$ illustrating waveform 161, remains high, with $\phi 2$ as waveform 162 and $\phi 3$ as waveform 163 remaining low. Also remaining low is the gate output waveform 164 which is activated just prior to the phase $\phi 1$ going low. When phase $\phi 1$ goes low, phase $\phi 2$ goes high and when phase $\phi 2$ goes low, phase $\phi 3$ goes high. The gate pulse 164 precedes the three phase pulse $\phi 1$, permitting the transfer of information held in transfer gate 14 to move into CCD register 18. The waveforms shown in FIG. 5 are representative of a long series of repetitious forms, as shown, up until time t. After time t, when oscillator 151 is inhibited, waveform 161 ($\phi 1$) again goes high as shown and waveforms 162, 163 and 164 all go low.

FIG. 6 illustrates circuitry for an output application of the invention. Outputs 31–39 (FIG. 2) are connected to one end respectively of resistors R2–R9, whose other ends are tied together to the input of amplifier 166. The input of amplifier 166 is also tied through resistor R1 to ground. Output 35 from floating gate amplifier transistor 114, representing the center pixel of a block, is connected to the input of amplifier 167. The outputs of amplifiers 166 and 167 are connected respectively to the positive and negative inputs of differential amplifier 168. Output 169 from amplifier 168 represents the difference in amplitude between the outputs of amplifiers 167 and 166.

MODE OF OPERATION

Referring to FIG. 1, the image of an object is impressed upon the imager matrix 11. In this particular embodiment, with a matrix of 324×340 pixels, approximately 600 milliseconds is required for the imaging process. This time is approximate and relates to the particular imager of this invention. An imager with a smaller matrix takes substantially less time. Upon the conclusion of the imaging process, gate 14 is enabled by the gate pulse 164 of FIG. 5. Also, the $\phi 1$, $\phi 2$ and $\phi 3$ phase pulses 161, 162 and 163, respectively, are activated to shift out the first row of CCD pixels into section 15 of output register 18, and also the three right most pixels into corner output amplifier group 42, with outputs 37, 38 and 39 of the respective floating point amplifiers corresponding to those first three bits. Then at an approximate 2 MHz rate, section 15 contents are shifted into section 16 and into corner output amplifier group 41.

This cycle is repeated with gate 14 again being enabled and the contents of the second row of CCD's from imager matrix 11 are transmitted in parallel into section 15 and corner output amplifier group 42. Again, output CCD register 18 shifts with the contents of section 16 shifting into section 17 and corner output amplifier group 40. Likewise, the contents of section 15 shifts into section 16 and corner output amplifier group 41. Section 15 is filled again along with corner output amplifier group 42. At that moment, the first three pixels of the first row from imager 11 are represented at outputs 31, 32 and 33 of group 40. The first three pixels of the second row are represented at the outputs 34, 35 and 36 of group 41. The first three pixels of the third row are represented at outputs 37, 38 and 39 of group 42. These outputs are simultaneously available and represent a block of 9 pixels. The first block is that formed of three pixels by three pixels in the lower right corner of imager matrix 11. As the shifting continues, the charge representing the first pixel of the first row of imager matrix 11 is discharged into charge drain 45. At this point, the pixels at the second, third and fourth positions of the first three rows are read out. This process continues and is an effective movement of the block from the right most lower corner to the left most lower corner as the shifting is continued until the last three pixels of the first three columns are effectively read out. The next two shifts may be ignored and the next block to be read out is formed of the first three pixels of the second, third and fourth rows. The process continues until the entire contents of imager matrix 11 has been shifted out.

As indicated earlier, the simultaneous outputs may be used in various, desired ways. For example, FIG. 6 illustrates the use of a weighting scheme that enables attaching a weight to the center pixel of the block and assigning a different weight to all of the other eight pixels in the block. In this preferred embodiment, the resistors R2-R9 are equal and are of 8 K ohms in value. Resistor R1 equals 1 K ohms. The gain of amplifier 166 is twice that of amplifier 167. Then if all the pixel charges in the block are equal, the voltage appearing at the input to amplifier 166 will be one half that appearing at the input to amplifier 167. That is, the net parallel resistance of resistors R2-R9 is 1 K ohm, the same as resistor R1, thus dividing in half, the input voltage (approximately 0.1 volts). The voltage present at the input to amplifier 167 is amplified and presented to the negative terminal of differential amplifier 168. The voltage present at the input to amplifier 166 is amplified (twice that of amplifier 167) and presented as a positive input to differential amplifier 168. Under those circumstances, the output at 169 is zero, because the inputs cancel. This is an indication of no difference in light intensity from that block. If the outputs at point 169 are not zero, then a change in color or light intensity is indicated. This information is sent to the memory of a digital computer for further analysis. This invention simply provides the simultaneous outputs and an indication of change or no change in light intensity from a given block.

This preferred embodiment indicates the use of an imager matrix 340×324 pixels. The preferred embodiment also indicates a three phase, buried type of structure. It is obvious to those skilled in the art to use available schemes, such as two phase instead of the three phase arrangement and also to use other than buried layer type structures. Further, a CCD gate and ouput register structure is not required for operation of this invention. The scope of the invention is all inclusive of these changes that are obvious to those skilled in the art.

What is claimed is:

1. A CCD imager having an imager matrix of A columns and B rows of pixels, and clocking means providing single and multi-phase clock output pulses for application to CCD structures, at least two of the multi-phase clock output pulses being applied to the imager matrix comprising:
    (a) output register means connected to receive at least two of the multi-phase clock output pulses and electrically connected to the imager matrix for receiving the charge packets representing the pixels, and having a capacity of at least N×A positions where N is an integer larger than one; and
    (b) N non-destructive readout means, each electrically connected to the register means for simultaneously indicating the amplitude of the charge packets representative of N pixels.

2. The imager of claim 1 wherein the N non-destructive readout means are positioned to indicate the amplitude of the charge packets of N pixels located in a single column.

3. The imager of claim 2 wherein the output register means is a shift register operable to shift A positions after receiving a row of charge packets representing one row of pixels.

4. The imager of claim 3 wherein the output register means is positioned at least partially around the imager matrix, and each N readout means is connected at a corner portion of the output register means.

5. The imager of claim 4 wherein there is provided N readout means connected at N corners of the output register means to effectively read the amplitude of the charge packets corresponding to N pixels of one column by N pixels of one row.

6. The imager of claim 5 wherein the N non-destructive readout means are floating gate amplifiers.

7. The imager of claim 6 further comprising a transfer gate means connected between the imager matrix and one section of the output register means, A positions in length, activated by the single clock output pulses from the clocking means to transmit in parallel all A positions of the adjacent row.

8. The imager of claim 7 wherein the transfer gate means comprises a CCD structure.

9. The imager of claim 8 wherein the output register means comprises a CCD register.

10. The imager of claim 9 wherein the multi-phase clock output pulses applied to the output register means is at a frequency B times that of the multi-phase clock output pulses applied to the imager matrix.

11. The imager of claim 10 wherein the clocking means provides an enabling pulse for the transfer gate means at the frequency of the imager matrix multi-phase pulses, immediately preceding the occurrence of the first of the multi phase pulses.

12. The imager of claim 11 wherein the multi-phase clock output pulses are three phase.

13. The imager of claim 12 wherein N equals 3.

14. The imager of claim 12 further comprising comparison means for comparing the charge on one pixel with the charges on the other pixels in an N×N block of pixels to determine equality or lack of equality.

15. The imager of claim 13 wherein the charge amplitude of the center pixel is compared with the charge amplitudes on the other eight pixels in a 3×3 block to determine equality or lack of equality.

16. The imager of claim 15 wherein the comparison means comprises:
    a resistor ladder connected to eight of the pixel inputs;
    a pair of amplifiers, one connected to receive a center pixel charge amplitude and the other connected to receive the input from the resistor ladder; and
    a differential amplifier for receiving the outputs of each of the pair of amplifiers for providing an output indicative of equality or lack of equality.

* * * * *